United States Patent
Sypolt et al.

(10) Patent No.: US 11,374,339 B2
(45) Date of Patent: Jun. 28, 2022

(54) CIRCUIT CARD LOCATING FEATURES FOR PLUGGABLE MODULE

(71) Applicant: TE Connectivity Services GmbH, Schaffhausen (CH)

(72) Inventors: Matthew Jeffrey Sypolt, Harrisburg, PA (US); Kevin Wesley Stauffer, Lancaster, PA (US); David Robert Baechtle, Dillsburg, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 17/024,785

(22) Filed: Sep. 18, 2020

(65) Prior Publication Data

US 2022/0094091 A1 Mar. 24, 2022

(51) Int. Cl.
*H01R 12/72* (2011.01)
*H05K 7/10* (2006.01)
*H01R 13/6581* (2011.01)
*H01R 13/631* (2006.01)

(52) U.S. Cl.
CPC ......... *H01R 12/721* (2013.01); *H01R 13/631* (2013.01); *H01R 13/6581* (2013.01); *H05K 7/1007* (2013.01)

(58) Field of Classification Search
CPC ............... H01R 12/721; H01R 13/631; H01R 13/6581; H05R 7/1007
USPC ........................................................ 439/59
See application file for complete search history.

(56) References Cited

U.S. PATENT DOCUMENTS

| 5,767,999 A | * | 6/1998 | Kayner | G06F 13/409 |
| | | | | 398/164 |
| 5,816,842 A | | 10/1998 | Thantrakul et al. | |
| 5,823,799 A | | 10/1998 | Tor et al. | |
| 6,811,326 B2 | * | 11/2004 | Keeble | G02B 6/426 |
| | | | | 385/92 |
| 7,381,077 B2 | * | 6/2008 | Chen | G02B 6/4201 |
| | | | | 439/350 |
| 8,926,134 B2 | * | 1/2015 | Hast | F21V 19/001 |
| | | | | 362/249.03 |
| 8,977,088 B2 | | 3/2015 | Castagna et al. | |
| 9,389,368 B1 | * | 7/2016 | Sharf | G02B 6/4269 |
| 9,509,102 B2 | * | 11/2016 | Sharf | G02B 6/4261 |
| 10,104,760 B1 | * | 10/2018 | Briant | G02B 6/4284 |
| 10,276,995 B2 | * | 4/2019 | Little | H01R 13/518 |
| 2006/0215968 A1 | * | 9/2006 | Kayner | G02B 6/4284 |
| | | | | 385/89 |
| 2007/0117458 A1 | * | 5/2007 | Winker | G02B 6/4277 |
| | | | | 439/607.01 |

(Continued)

*Primary Examiner* — Peter G Leigh

(57) ABSTRACT

A pluggable module includes an outer housing having a cavity between an upper wall and a lower wall. A circuit card is received in the cavity having a card edge configured to be received in a card slot of a communication connector. A circuit card holder engages the circuit card and holds the circuit card in the cavity of the outer housing. The circuit card holder includes a locating fin at a top of the circuit card holder. The locating fin has a sacrificial upper edge configured to engage the outer housing to locate the circuit card holder and the circuit card in the cavity. The sacrificial upper edge is deformed when engaging the outer housing to press the circuit card holder and the circuit card in a downward biasing direction.

20 Claims, 4 Drawing Sheets

(56) References Cited

U.S. PATENT DOCUMENTS

| | | | | |
|---|---|---|---|---|
| 2007/0183128 | A1* | 8/2007 | Pirillis | H05K 7/20418 |
| | | | | 361/715 |
| 2011/0306244 | A1* | 12/2011 | Zhang | H01R 13/65914 |
| | | | | 439/624 |
| 2014/0302694 | A1* | 10/2014 | Qiao | H01R 13/6275 |
| | | | | 439/78 |
| 2015/0318642 | A1* | 11/2015 | Lee | H01R 13/506 |
| | | | | 439/607.05 |
| 2016/0149324 | A1* | 5/2016 | Regnier | H01R 43/205 |
| | | | | 439/76.1 |
| 2017/0133777 | A1* | 5/2017 | Little | H01R 13/6275 |
| 2018/0338387 | A1* | 11/2018 | Park | G02B 6/4269 |
| 2019/0044299 | A1* | 2/2019 | Kazav | H01R 13/518 |

\* cited by examiner

# CIRCUIT CARD LOCATING FEATURES FOR PLUGGABLE MODULE

BACKGROUND OF THE INVENTION

The subject matter herein relates generally to pluggable modules.

Some communication systems utilize pluggable modules that are electrically connected to communication connectors to interconnect various components of the system for data communication. Typically, receptacle assemblies having receptacle cages receive pluggable modules, such as I/O modules, to electrically connect the pluggable modules to the communication connector. The pluggable modules typically include a circuit card having a card edge that is received in a card slot of the communication connector. Known pluggable modules are not without disadvantages. For instance, locating the circuit card within the housing of the pluggable module may be difficult. Proper positioning of the circuit card is necessary for loading into the card slot of the communication connector to avoid damage to the components of the circuit card and/or the communication connector.

A need remains for locating features for locating circuit cards of pluggable modules in a reliable manner.

BRIEF DESCRIPTION OF THE INVENTION

In one embodiment, a pluggable module is provided. The pluggable module includes an outer housing extending between a mating end and a cable end. The outer housing has an upper wall and a lower wall. The outer housing has a cavity between the upper wall and the lower wall. The pluggable module includes a circuit card received in the cavity. The circuit card has a card edge located proximate to the mating end of the outer housing. The card edge is configured to be received in a card slot of a communication connector. The pluggable module includes a circuit card holder engaging the circuit card and holding the circuit card in the cavity of the outer housing. The circuit card holder includes a locating fin at a top of the circuit card holder. The locating fin has a sacrificial upper edge configured to engage the outer housing to locate the circuit card holder and the circuit card in the cavity. The sacrificial upper edge is deformed when engaging the outer housing to press the circuit card holder and the circuit card in a downward biasing direction.

In another embodiment, a pluggable module is provided. The pluggable module includes an outer housing extending between a mating end and a cable end. The outer housing has an upper wall and a lower wall. The outer housing has a cavity between the upper wall and the lower wall. The outer housing includes a support rail in the cavity having an upper support surface. The pluggable module includes a circuit card received in the cavity. The circuit card has an upper card surface and a lower card surface. The circuit card has a card edge between the upper card surface and the lower card surface. The card edge is configured to be received in a card slot of a communication connector. The circuit card includes a card support at the lower card surface. The card support faces the upper support surface of the support rail. The pluggable module includes a circuit card holder engaging the circuit card and holding the circuit card in the cavity of the outer housing. The circuit card holder includes a locating fin at a top of the circuit card holder includes the locating fin having a sacrificial upper edge configured to engage the outer housing to locate the circuit card holder and the circuit card in the cavity. The sacrificial upper edge is deformed when engaging the outer housing to press the card support surface of the circuit card in a downward biasing direction against the upper support surface of the support rail.

In a further embodiment, a communication system is provided. The system includes a receptacle connector assembly including a receptacle cage having cage walls forming a module channel receiving the pluggable module. The cage walls extend between a front end and a rear end of the receptacle cage. The receptacle connector assembly includes a communication connector having a card slot received in the receptacle cage proximate to the rear end. The system includes a pluggable module received in the module channel and mated with the communication connector. The pluggable module includes an outer housing extending between a mating end and a cable end. The pluggable module includes an upper wall and a lower wall. The pluggable module has a cavity between the upper wall and the lower wall. The outer housing includes a support rail in the cavity having an upper support surface. The pluggable module includes a circuit card received in the cavity. The circuit card includes an upper card surface and a lower card surface. The circuit card includes a card edge between the upper card surface and the lower card surface. The card edge is received in the card slot of the communication connector. The circuit card includes a card support at the lower card surface. The card support faces the upper support surface of the support rail. The pluggable module includes a circuit card holder engaging the circuit card and holds the circuit card in the cavity of the outer housing. The circuit card holder includes a locating fin at a top of the circuit card holder. The locating fin has a sacrificial upper edge configured to engage the outer housing to locate the circuit card holder and the circuit card in the cavity. The sacrificial upper edge is deformed when engaging the outer housing to press the card support surface of the circuit card in a downward biasing direction against the upper support surface of the support rail.

DETAILED DESCRIPTION OF THE INVENTION

Figure 1:
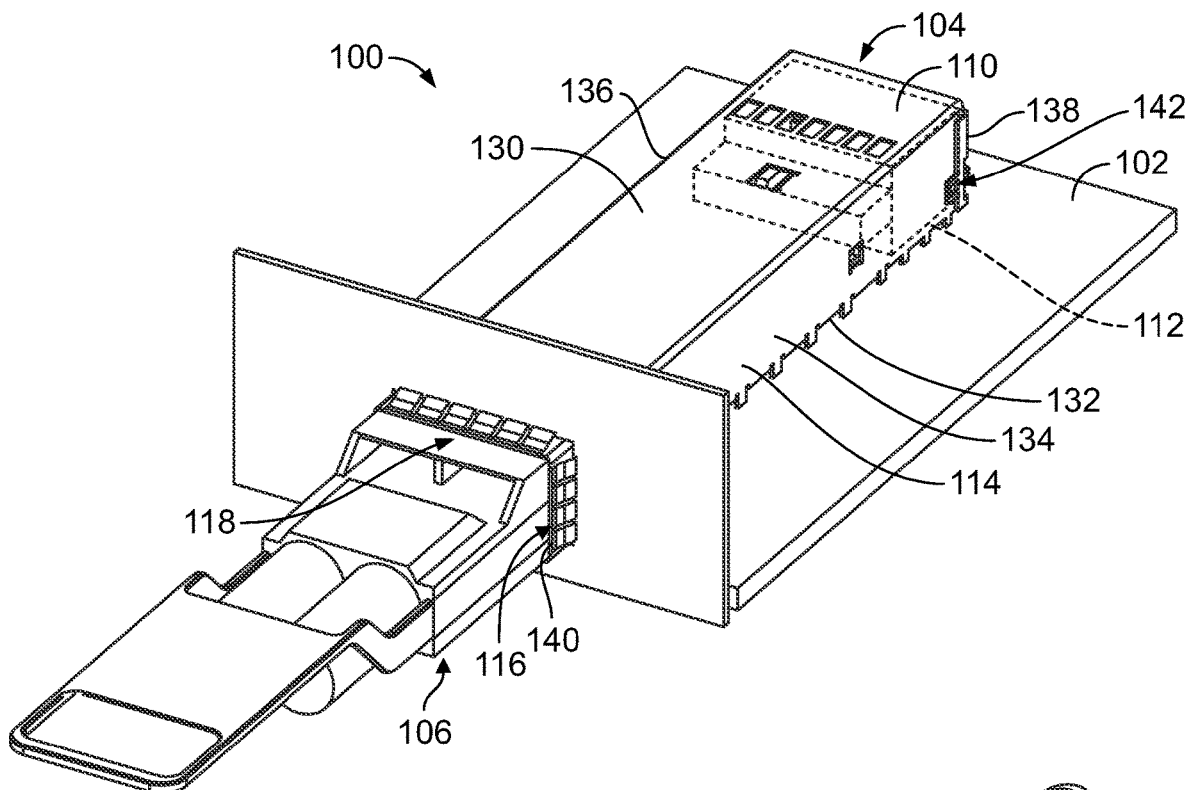
FIG. 1 is a front perspective view of a communication system having a pluggable module formed in accordance with an exemplary embodiment.

FIG. 1 is a front perspective view of a communication system 100 formed in accordance with an exemplary embodiment. The communication system 100 includes a circuit board 102 and a receptacle connector assembly 104 mounted to the circuit board 102. A pluggable module 106 (shown in FIG. 2) is configured to be electrically connected to the receptacle connector assembly 104. The pluggable module 106 is electrically connected to the circuit board 102 through the receptacle connector assembly 104.

In an exemplary embodiment, the receptacle connector assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 encloses and provides electrical shielding for the communication connector 112. The receptacle cage 110 is configured to surround at least a portion of the pluggable module 106 to provide shielding for the pluggable module 106.

The receptacle cage 110 includes a plurality of cage walls 114 surrounding a cavity 116. The cavity 116 may receive the communication connector 112 in various embodiments. The cavity 116 defines one or more module channels 118 for receipt of corresponding pluggable modules 106. The cage walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed cage member with the cage walls 114 being shielding walls.

In the illustrated embodiment, the receptacle cage 110 includes a single module channel 118 for receiving a single pluggable module 106. The receptacle cage 110 has a port that is open at the front of the receptacle cage 110 to receive the pluggable module 106. Any number of module channels 118 may be provided in various embodiments. For example, the receptacle cage 110 may constitute a stacked cage member having upper and lower module channels 118 to receive multiple pluggable modules 106 in a stacked arrangement in an alternative embodiment. The upper and lower module channels 118 may be arranged in a single column; however, the receptacle cage 110 may include multiple columns of ganged module channels 118 in alternative embodiments (for example, 2×2, 3×2, 4×2, 4×3, etc.). In other various embodiments, rather than being a stacked cage member, the receptacle cage 110 may include ganged module channels 118 in a single row (for example, 1×2, 1×4, etc.). Optionally, multiple communication connectors 112 may be arranged within the receptacle cage 110, such as when multiple columns or rows of module channels 118 are provided.

In an exemplary embodiment, the cage walls 114 of the receptacle cage 110 include a top wall 130, a bottom wall 132, a first side wall 134, a second side wall 136 and a rear wall 138. The bottom wall 132 may rest on the circuit board 102. However, in alternative embodiments, the receptacle cage 110 may be provided without the bottom wall 132. The receptacle cage 110 extends between a front end 140 and a rear end 142. The port is provided at the front end 140 to receive the pluggable module 106 through the front end 140. The cage walls 114 define the cavity 116. For example, the cavity 116 may be defined by the top wall 130, the bottom wall 132, the side walls 134, 136 and the rear wall 138. Other cage walls 114 may separate or divide the cavity 116 into a plurality of module channels 118, such as stacked or ganged module channels. For example, the cage walls 114 may include a divider (not shown). The divider may be a horizontal divider positioned between upper and lower module channels 118. In other various embodiments, the divider may define a vertical separator panel (not shown), such as parallel to the side walls 134, 136.

In an exemplary embodiment, the communication connector 112 is received in the cavity of the receptacle cage 110, such as proximate to the rear wall 138. However, in alternative embodiments, the communication connector 112 may be located behind the rear wall 138 exterior of the receptacle cage 110 and extend into the cavity 116 to interface with the pluggable module(s) 106. For example, the rear wall 138 may include an opening to receive components therethrough. The communication connector 112 is coupled to the circuit board 102. The receptacle cage 110 is mounted to the circuit board 102 over the communication connector 112.

In an exemplary embodiment, the pluggable module 106 is loaded into the receptacle cage 110 through the front end 140 to mate with the communication connector 112. The shielding cage walls 114 of the receptacle cage 110 provide electrical shielding around the communication connector 112 and the pluggable module 106, such as around the mating interface between the communication connector 112 and the pluggable modules 106. One or more gaskets may be provided at the front end 140 to interface with the pluggable module 106 to electrically connect the receptacle cage 110 to the pluggable module 106 and to shield any gaps between the pluggable module 106 and the receptacle cage 110 to prevent EMI leakage through such gaps. The gasket(s) may extend around the exterior of the receptacle cage 110 at the front end 140 to interface with a panel.

In an exemplary embodiment, the receptacle connector assembly 104 may include one or more heat sinks (not shown) for dissipating heat from the pluggable module(s) 106. For example, the heat sink may be coupled to the top wall 130 for engaging the pluggable module 106 when the pluggable module 106 is received in the module channel 118. The heat sink may extend through an opening in the top wall 130 to directly engage the pluggable module 106.

Figure 2:
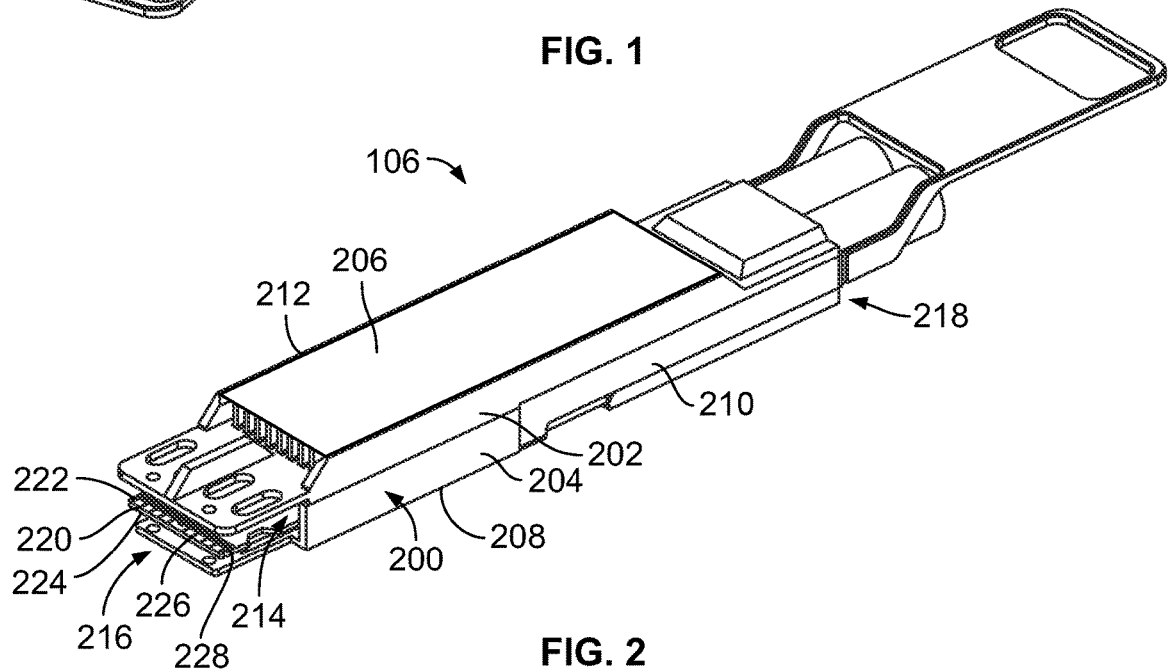
FIG. 2 is a rear perspective view of the pluggable module in accordance with an exemplary embodiment.

FIG. 2 is a rear perspective view of the pluggable module 106 in accordance with an exemplary embodiment. The pluggable module 106 has an outer housing 200, which may be defined by one or more shells. For example, the outer housing 200 may include an upper shell 202 and a lower shell 204. The upper shell 202 includes a top wall 206. The lower shell 204 includes a bottom wall 208. The upper shell 202 and/or the lower shell 204 includes side walls 210, 212. The outer housing 200 includes a cavity 214 defined between the upper shell 202 and the lower shell 204. In an exemplary embodiment, the outer housing 200 may be thermally conductive and/or may be electrically conductive, such as to provide EMI shielding for the pluggable module 106. For example, the upper shell 202 and the lower shell 204 may be die cast shells manufactured from metal material, such as aluminum. The outer housing 200 includes a mating end 216 and an opposite front end 218. The front end 218 may be a cable end having a cable extending therefrom to another component within the system. The mating end 216 is configured to be inserted into the corresponding module channel 118 (shown in FIG. 1).

The pluggable module 106 includes a circuit card 220 that is configured to be communicatively coupled to the communication connector 112 (shown in FIG. 1). The circuit card 220 has an upper surface 222 and a lower surface 224. The circuit card 220 has a mating edge 226 extending between the upper and lower surfaces 222, 224. The mating edge 226 is configured to be plugged into a card slot of the communication connector 112 (shown in FIG. 1). Contact pads 228 are provided at the mating edge 226, such as along the upper surface 222 and the lower surface 224 for electrical connection with contacts of the communication connector 112. The module circuit board 220 is received in the cavity 214 and surrounded by the upper shell 202 and the lower shell 204. The circuit card 220 is accessible at the mating end 216 of the outer housing 200. The circuit card 220 may include components, circuits and the like used for operating and/or using the pluggable module 106. For example, the circuit card 220 may have conductors, traces, pads, electronics, sensors, controllers, switches, inputs, outputs, and the like associated with the circuit card 220, which may be mounted to the circuit card 220, to form various circuits.

In an exemplary embodiment, the outer housing 200 provides heat transfer for the circuit card 220, such as for the electronic components on the circuit card 220. For example, the circuit card 220 is in thermal communication with the upper shell 202 and/or the lower shell 204. The outer housing 200 transfers heat from the circuit card 220. In an exemplary embodiment, the upper shell 202 is configured to interface with a heat sink to dissipate heat from the pluggable module 106. In various embodiments, the outer housing 200 may include a plurality of heat transfer fins (not shown) along at least a portion of the pluggable module 106, such as the upper wall 204. The fins transfer heat away from the main shell of the outer housing 200, and thus from the circuit card 220 and associated components. The fins may be parallel plates that extend lengthwise; however, the fins may have other shapes in alternative embodiments, such as cylindrical or other shaped posts.

Figure 3:
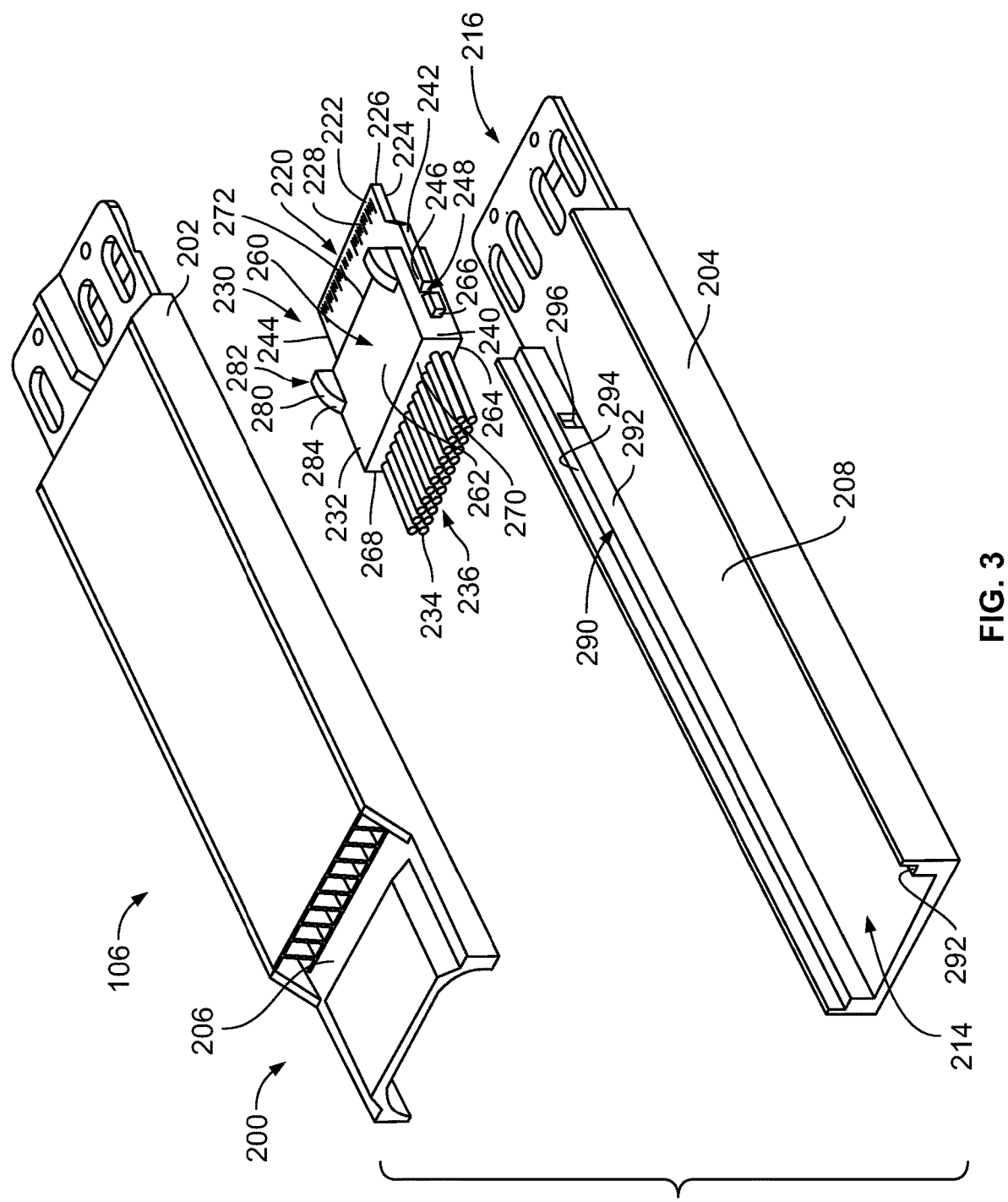
FIG. 3 is an exploded view of the pluggable module in accordance with an exemplary embodiment.

FIG. 3 is an exploded view of the pluggable module 106 in accordance with an exemplary embodiment. The pluggable module 106 includes the upper shell 202 and the lower shell 204 forming the outer housing 200. The pluggable module 106 includes a cable assembly 230 received in the cavity 214 between the upper shell 202 and the lower shell 204. The cable assembly 230 includes the circuit card 220. The cable assembly 230 is positioned in the cavity 214 for mating with the communication connector 112 (shown in FIG. 1).

Figure 4:
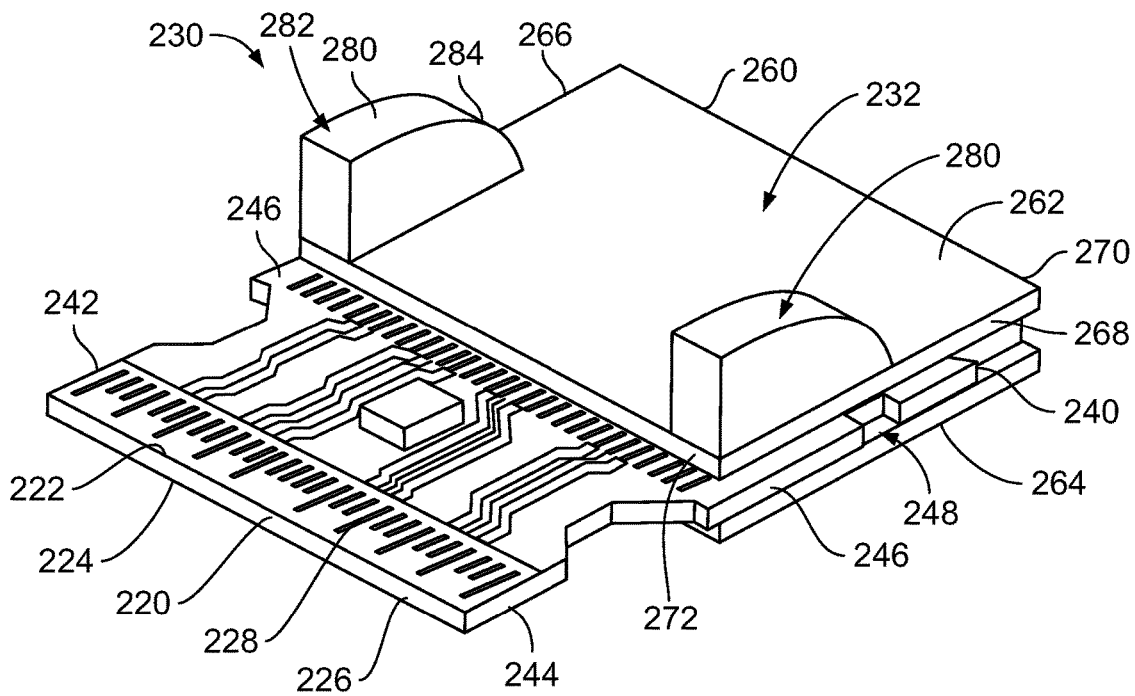
FIG. 4 is a rear perspective view of a cable assembly of the pluggable module in accordance with an exemplary embodiment.
Figure 5:
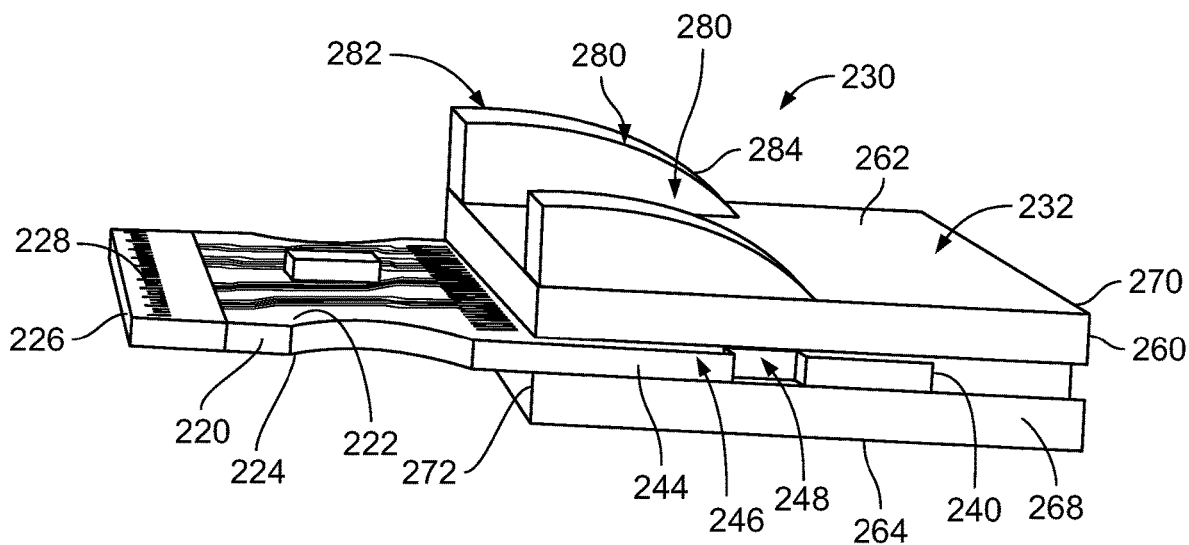
FIG. 5 is a side view of the cable assembly in accordance with an exemplary embodiment.

With additional reference to FIG. 4, which is a rear perspective view of the cable assembly 230, and to FIG. 5, which is a side view of the cable assembly 230, the cable assembly 230 includes the circuit card 220, a circuit card holder 232 and a plurality of wires 234 (FIG. 3) forming one or more cables 236. The wires 234 are terminated to the circuit card 220. For example, the wires 234 may be soldered to the circuit card 220. In various embodiments, the wires 234 are coupled to traces or pads of the circuit card 220 at the upper surface 222 and/or the lower surface 224. The circuit card holder 232 holds the circuit card 220. In various embodiments, the circuit card holder 232 holds the ends of the wires 234. For example, the circuit card holder 232 may provide strain relief for the wires 234. The circuit card holder 232 is manufactured from a dielectric material, such as a plastic material. In various embodiments, the circuit card holder 232 is formed in situ on the circuit card 220 and the wires 234. For example, the circuit card holder 232 may be overmolded on to the circuit card 220 and the wires 234.

The circuit card 220 includes a front edge 240 opposite the mating edge 226. Side edges 242, 244 extend between the front edge 240 and the mating edge 226. The wires 234 are terminated to the circuit card 220 at the front edge 240. The circuit card holder 232 is coupled to the circuit card 220 at the front edge 240. In an exemplary embodiment, a portion of the circuit card 220 extends rearward of the circuit card holder 232 to the mating edge 226. In an exemplary embodiment, side flanges 246 of the circuit card 220 extend from the sides of circuit card holder 232 to the side edges 242, 244. The side flanges 246 are exposed beyond the sides of the circuit card holder 232. In an exemplary embodiment, the side flanges 246 include openings 248 used for positioning the circuit card 220 relative to the outer housing 200. For example, the openings 248 may receive locating features of the outer housing 200 to locate the circuit card 220 relative to the outer housing 200. In the illustrated embodiment, the openings 248 are cutouts formed in the side edges 242, 244.

The circuit card holder 232 includes a holder body 260. In an exemplary embodiment, the holder body 260 is manufactured from a dielectric material, such as a plastic material. In various embodiments, the holder body 260 may be an overmold body formed in place on the circuit card 220 and the wires 234. The holder body 260 extends between a top 262 and a bottom 264. The holder body 260 includes a first side 266 and a second side 268. The holder body 260 includes a front 270 and a rear 272. In an exemplary embodiment, the side flanges 246 of the circuit card 220 extend from the first side 266 and the second side 268 such that portions of the circuit card 220 are exposed beyond the first and second sides 266, 268. Alternatively, the holder body 260 may extend beyond the side edges 242, 244 of the circuit card 220. In the illustrated embodiment, circuit card 220 extends rearward beyond the rear 272 of the holder body 260. For example, the mating edge 226 is located rearward of the rear 272 of the holder body 260. The contact pads 228 are provided on the exposed portion of the circuit card 220 rearward of the holder body 260. The exposed portion of the circuit card 220 is configured to be plugged into the card slot of the communication connector 112.

In the illustrated embodiment, the holder body 260 extends forward of the front edge 240 of the circuit card 220. For example, the front 270 is located forward of the front edge 240. The front portion of the holder body 260 surrounds the wires 234. The front portion of the holder body 260 provides strain relief for the wires 234. An upper portion of the holder body 260 extend along the upper surface 222 of the circuit card 220. The lower portion of the holder body 260 extends along the lower surface 224 of the circuit card 220. In various embodiments, the circuit card 220 may include openings (not shown) therethrough and the holder body 260 may extend through the openings between the upper portion and the lower portion. For example, during the overmolded process, the plastic material they flow through the openings while forming the upper portion and the lower portion. Alternatively, the holder body 260 may only include the upper portion such that no portion of the holder body 260 extends below the circuit card 220 along the lower surface 224.

In an exemplary embodiment, the circuit card holder 232 includes one or more locating fins 280 at the top 262 of the holder body 260. The locating fins 280 are used for positioning the cable assembly 230 in the outer housing 200. For example, the locating fins 280 are used to position the circuit card 220 within the cavity 214 for mating with the communication connector 112. In an exemplary embodiment, the locating fins 280 extend from the top 262. Each locating fin 280 includes a sacrificial upper edge 282. The sacrificial upper edge 282 is provided at the tip of the locating fins 280. Optionally, each locating fin 280 may include a ramp 284 extending from the top 262 to the sacrificial upper edge 282. The ramp 284 may be curved in various embodiments.

The sacrificial upper edge 282 is configured to engage the outer housing 200 when the cable assembly 230 is loaded into the outer housing 200. For example, the sacrificial upper edge 282 is configured to engage an interior surface of the upper wall 204 of the upper shell 202. The locating fins 280 press against the upper wall 204 of the upper shell 202 to force the cable assembly 230 in a downward direction. The sacrificial upper edge 282 is deformable when engaging the outer housing 200. For example, the sacrificial upper edge 282 changes shape when engaging the outer housing. In various embodiments, the sacrificial upper edge 282 is plastically deformed when the circuit card holder 232 is loaded into the outer housing 200. For example, the sacrificial upper edge 282 may be crushed against the upper shell 202 when the circuit card holder 232 is loaded into the cavity 214. In various embodiments, the sacrificial upper edge 282 may be elastically deformed when the circuit card holder 232 is loaded into the outer housing 200. The deformation of the locating fins 280 causes the circuit card holder 232 to press downward in a downward biasing direction. The locating fins 280 hold the circuit card holder 232 in a downward position and prevents liftoff, or upward movement, of the circuit card 220 within the cavity 214.

In the illustrated embodiment, the locating fins 280 are provided at the first and second sides 266, 268. Additionally, or alternatively, locating fins 280 may be located at a center of the holder body 260 between the first and second sides 266, 268. In other various embodiments, a continuous locating fin 280 may extend an entire width of the holder body 260 between the first and second sides 266, 268. In the illustrated embodiment, the locating fins 280 are provided at the rear 272. Alternatively, the locating fins 280 may be provided at the front 270 or at another position along the length of the holder body 260, such as approximately centered between the front 270 and the rear 272. In various alternative embodiments, the circuit card holder 232 may include locating fins 280 that are offset, such as one or more locating fins 280 provided at the rear 272 and one or more locating fins 280 provided at the front 270.

With reference back to FIG. 3, in an exemplary embodiment, the outer housing 200 includes locating features 290 for locating the cable assembly 230 within the outer housing 200. In an exemplary embodiment, the locating features 290 include support rails 292 extending along the side walls 210, 212 of the lower shell 204. Each support rail 292 has an upper support surface 294 used to support the cable assembly 230. In an exemplary embodiment, the support rails 292 support the sides flanges 246 of the circuit card 220. For example, the sides flanges 246 may rest upon the upper support surfaces 294. In an exemplary embodiment, the locating fins 280 press the cable assembly 230 and a downward biasing direction such that the lower surfaces 224 of the sides flanges 246 are pressed against the upper support surfaces 294 of the support rails 292. The support rails 292 orient and position the circuit card 220 within the cavity 214 for mating with the communication connector 112. For example, the support rails 292 determine the vertical position of the circuit card 220 and the locating fins 280 of the circuit card holder 232 ensure that the circuit card 220 remains downward biased against the support rails 292. The support rails 292 prevent downward movement of the circuit card 220 within the cavity 214. The locating fins 280 prevent upward movement of the circuit card 220 within the cavity 214.

In an exemplary embodiment, the locating features 290 include locating posts 296 extending from the support rails 292. The locating posts 296 are received in corresponding openings 248 of the circuit card 220. The locating posts 296 holding a longitudinal position of the circuit card 220 within the cavity 214. For example, the locating posts 296 prevent forward or rearward movement of the circuit card 220 within the cavity 214.

Figure 6:
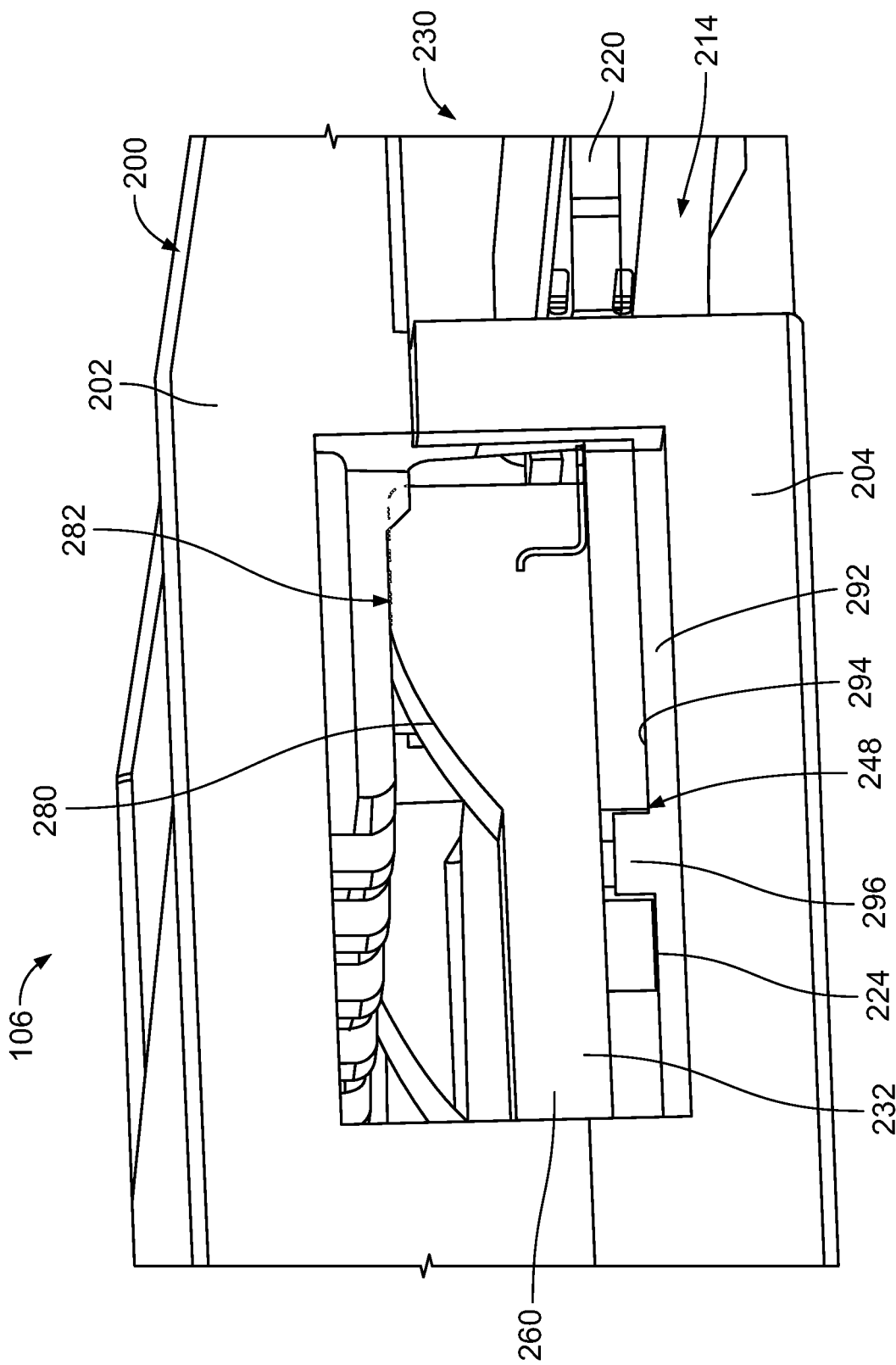
FIG. 6 is a partial sectional view of the pluggable module in accordance with an exemplary embodiment.

FIG. 6 is a partial sectional view of the pluggable module 106 in accordance with an exemplary embodiment. FIG. 6 illustrates the cable assembly 230 received in the cavity 214 of the outer housing 200. The circuit card holder 232 and the circuit card 220 are arranged in the cavity 214 between the upper shell 202 and the lower shell 204. The lower surface 224 of the circuit card 220 is seated on the upper support surface 294 of the support rail 292. The holder body 260 presses the circuit card 220 in a downward biasing direction to hold the circuit card 220 in a seated position against the support rail 292. The locating fin 280 engages the upper wall 204 of the upper shell 202. The sacrificial upper edge 282 is defined by the upper wall 204 when the locating fin 280 is loaded into the cavity 214. The compression of the locating fin 280 in the sacrificial upper edge 282 is deformed causes a downward biasing force to press the circuit card 220 against the support rail 292. In an exemplary embodiment, the locating post 296 is received in the opening 248 to locate the circuit card 220 within the cavity 214.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A pluggable module comprising:
an outer housing extending between a mating end and a cable end, the outer housing having an upper wall and a lower wall, the outer housing having a cavity between the upper wall and the lower wall;
a circuit card received in the cavity, the circuit card having a card edge located proximate to the mating end of the outer housing, the card edge configured to be received in a card slot of a communication connector; and
a circuit card holder engaging the circuit card and holding the circuit card in the cavity of the outer housing, the circuit card holder including a locating fin at a top of the circuit card holder, the locating fin having a sacrificial upper edge configured to engage the outer housing to locate the circuit card holder and the circuit card in the cavity, the sacrificial upper edge being deformed when engaging the outer housing to press the circuit card holder and the circuit card in a downward biasing direction, wherein a shape of the locating fin changes when the locating fin engages the upper wall of the outer housing.

2. The pluggable module of claim 1, wherein the locating fin is manufactured from a plastic material being deformable.

3. The pluggable module of claim 1, wherein the locating fin includes a ramp leading to the sacrificial upper edge.

4. The pluggable module of claim 1, wherein a shape of the locating fin at the sacrificial upper edge changes when the locating fin engages the upper wall of the outer housing.

5. The pluggable module of claim 1, wherein the circuit card includes a card support, the circuit card holder pressing the card support downward against the outer housing to locate the circuit card holder and the circuit card in the cavity.

6. The pluggable module of claim 1, wherein the locating fin is deformable from a formed height to a deformed height, the deformed height being less than the formed height.

7. The pluggable module of claim 1, wherein the outer housing includes a support rail in the cavity having an upper support surface, the locating fin pressing at least one of the circuit card holder and the circuit card downward against the upper support surface of the support rail.

8. The pluggable module of claim 7, wherein the support rail includes a locating post, the circuit card including an opening receiving the locating post to locate the circuit card relative to the outer housing.

9. The pluggable module of claim 7, wherein the circuit card includes a ledge extending outward from a side of the circuit card holder, the ledge being pressed downward against the upper support surface of the support rail.

10. The pluggable module of claim 9, wherein the upper support surface of the support rail is spaced from the upper wall by a first distance, the ledge being located a second distance from the upper edge, wherein, prior to loading the circuit card holder into the outer housing, the second distance is greater than the first distance, and wherein after loading the circuit card holder into the outer housing, the second distance is equal to the first distance.

11. The pluggable module of claim 1, wherein the circuit card holder includes a first side and a second side, the locating fin provided at the first side, the circuit card holder further comprising a second locating fin at the second side, the second locating fin having a sacrificial upper edge configured to engage the outer housing to locate the circuit card holder in the circuit card in the cavity, the sacrificial upper edge of the second locating fin being deformed when engaging the outer housing to press the circuit card holder in the circuit card in a downward biasing direction.

12. The pluggable module of claim 1, wherein the circuit card holder includes a holder body engaging the circuit card.

13. The pluggable module of claim 12, wherein the holder body is overmolded on the circuit card and surrounds wires terminated to the circuit card, the holder body providing strain relief for the wires.

14. The pluggable module of claim 12, wherein the holder body extends along an upper surface of the circuit card and extends along a lower surface of the circuit card.

15. A pluggable module comprising:
an outer housing extending between a mating end and a cable end, the outer housing having an upper wall and a lower wall, the outer housing having a cavity between the upper wall and the lower wall, the outer housing including a support rail in the cavity having an upper support surface;
a circuit card received in the cavity, the circuit card having an upper card surface and a lower card surface, the circuit card having a card edge between the upper card surface and the lower card surface, the card edge configured to be received in a card slot of a communication connector, the circuit card including a card support at the lower card surface, the card support facing the upper support surface of the support rail; and
a circuit card holder engaging the circuit card and holding the circuit card in the cavity of the outer housing, the circuit card holder including a locating fin at a top of the circuit card holder, the locating fin having a sacrificial upper edge configured to engage the outer housing to locate the circuit card holder and the circuit card in the cavity, the sacrificial upper edge being deformed when engaging the outer housing to press the card support surface of the circuit card in a downward biasing direction against the upper support surface of the support rail wherein a shape of the locating fin changes when the locating fin engages the outer housing.

16. The pluggable module of claim 15, wherein the locating fin includes a ramp leading to the sacrificial upper edge.

17. The pluggable module of claim 15, wherein the locating fin is deformable from a formed height to a deformed height, the deformed height being less than the formed height.

18. The pluggable module of claim 15, wherein the circuit card includes a ledge extending outward from a side of the circuit card holder defining the card support, the ledge being pressed downward against the upper support surface of the support rail, the upper support surface of the support rail being spaced from the upper wall by a first distance, the ledge being located a second distance from the upper edge, wherein, prior to loading the circuit card holder into the outer housing, the second distance is greater than the first distance, and wherein after loading the circuit card holder into the outer housing, the second distance is equal to the first distance.

19. The pluggable module of claim 15, wherein the circuit card holder includes a first side and a second side, the locating fin provided at the first side, the circuit card holder further comprising a second locating fin at the second side, the second locating fin having a sacrificial upper edge configured to engage the outer housing to locate the circuit card holder in the circuit card in the cavity, the sacrificial upper edge of the second locating fin being deformed when engaging the outer housing to press the circuit card holder in the circuit card in a downward biasing direction.

20. A communication system comprising:
a receptacle connector assembly including a receptacle cage having cage walls forming a module channel receiving the pluggable module, the cage walls extending between a front end and a rear end of the receptacle cage, the receptacle connector assembly including a communication connector having a card slot received in the receptacle cage proximate to the rear end; and
a pluggable module received in the module channel and mated with the communication connector, the pluggable module including an outer housing extending between a mating end and a cable end, the pluggable module including an upper wall and a lower wall, the pluggable module having a cavity between the upper wall and the lower wall, the outer housing including a support rail in the cavity having an upper support surface, the pluggable module including a circuit card received in the cavity, the circuit card having an upper card surface and a lower card surface, the circuit card having a card edge between the upper card surface and the lower card surface, the card edge received in the card slot of the communication connector, the circuit card including a card support at the lower card surface, the card support facing the upper support surface of the support rail, the pluggable module including a circuit card holder engaging the circuit card and holding the circuit card in the cavity of the outer housing, the circuit card holder including a locating fin at a top of the circuit card holder, the locating fin having a sacrificial upper edge configured to engage the outer housing to locate the circuit card holder and the circuit card in the cavity, the sacrificial upper edge being deformed when engaging the outer housing to press the card support surface of the circuit card in a downward biasing direction against the upper support surface of the support rail, wherein a shape of the locating fin changes when the locating fin engages the outer housing.

* * * * *